(12) United States Patent
Morgan-Jones et al.

(10) Patent No.: US 11,817,395 B2
(45) Date of Patent: Nov. 14, 2023

(54) DEPOSITIVE SHIELDING FOR FIDUCIAL PROTECTION FROM REDEPOSITION

(71) Applicant: FEI Company, Hillsboro, OR (US)

(72) Inventors: Sean Morgan-Jones, Portland, OR (US); Mark Najarian, Beaverton, OR (US); Michael Schmidt, Gresham, OR (US); Victoriea Bird, Beaverton, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/037,276

(22) Filed: Sep. 29, 2020

(65) Prior Publication Data

US 2022/0102284 A1 Mar. 31, 2022

(51) Int. Cl.
| | |
|---|---|
| *H01L 23/544* | (2006.01) |
| *H01J 37/305* | (2006.01) |
| *H01J 37/09* | (2006.01) |
| *H01L 21/263* | (2006.01) |
| *H01L 21/285* | (2006.01) |
| *C23C 16/48* | (2006.01) |
| *H01L 21/02* | (2006.01) |

(52) U.S. Cl.
CPC .......... *H01L 23/544* (2013.01); *H01J 37/09* (2013.01); *H01J 37/3053* (2013.01); *C23C 16/486* (2013.01); *H01J 2237/3174* (2013.01); *H01J 2237/31732* (2013.01); *H01L 21/02115* (2013.01); *H01L 21/02271* (2013.01); *H01L 21/2633* (2013.01); *H01L 21/28568* (2013.01); *H01L 2223/54426* (2013.01)

(58) Field of Classification Search
None
See application file for complete search history.

(56) References Cited

U.S. PATENT DOCUMENTS

| | | | | |
|---|---|---|---|---|
| 2015/0318139 | A1 * | 11/2015 | Amemiya | H01J 37/3045 250/397 |
| 2015/0369710 | A1 * | 12/2015 | Fuller | H01J 37/317 427/595 |

FOREIGN PATENT DOCUMENTS

| | | | | |
|---|---|---|---|---|
| EP | 1491654 A1 | * | 6/2004 | ............. C23C 16/04 |
| JP | H05129389 | * | 5/1993 | ............. H01L 21/66 |
| KR | 20150126288 | * | 11/2015 | .......... H01J 37/3174 |

OTHER PUBLICATIONS

"Electron channelling contrast imaging (ECCI)," Scanning electron microscopy of nitrides, available at: http://gan-sem.phys.strath.ac.uk/techniques/electron-channelling-contrast-imaging/, 4 pages, retrieved on Sep. 29, 2020.

(Continued)

*Primary Examiner* — Alexander G Ghyka
(74) *Attorney, Agent, or Firm* — Klarquist Sparkman, LLP

(57) ABSTRACT

Redeposition of substrate material on a fiducial resulting from charged particle beam (CPB) or laser beam milling of a substrate can be reduced with a shield formed on the substrate surface. The shield typically has a suitable height that can be selected based on proximity of an area to be milled to the fiducial. The shield can be formed with the milling beam using beam-assisted chemical vapor deposition (CVD). The same or different beams can be used for milling and beam-assisted CVD.

24 Claims, 7 Drawing Sheets

(56) References Cited

OTHER PUBLICATIONS

Matsui, "Three-Dimensional Nanostructure Fabrication by Focused Ion Beam Chemical Vapor Deposition," Chapter 7, *Springer Handbook of Nanotechnology*, pp. 211-229 (2010).
Wanzenboeck et al., "Focused Ion Beam Induced Chemical Vapor Deposition (FIB-CVD) for Local Nanodeposition of Dielectric Material," $203^{rd}$ ECS Meeting—Paris, France, 1 page (Apr. 27-May 2, 2003).

* cited by examiner

DEPOSITIVE SHIELDING FOR FIDUCIAL PROTECTION FROM REDEPOSITION

FIELD

The disclosure pertains to ion beam and laser milling of substrates.

BACKGROUND

Many focused ion beam (FIB) workflows use fiducials for alignment and measurement near a milling site. As the use of FIB and pulsed laser milling increases, larger amounts of material are being removed during milling. With this increase in material removal, there is also an increase in redeposited material on and around the milling area. Often this redeposited material ends up on the fiducial which negatively impacts the integrity of the fiducial and leads to erroneous pattern matches, edge definition, and/or false positive measurements.

FIG. 1A illustrates a substrate 100 on which a fiducial 102 is defined. The fiducial 102 is generally used to establish precise locations on the substrate for additional processing, measurement, or other investigation. FIG. 1B illustrates the substrate 100 after ion beam milling to produce a milled groove 104. As shown in FIG. 1B, features of the fiducial 102 are less distinct than in FIG. 1A, complicating the subsequent use of the fiducial 102 for alignment.

SUMMARY

Methods comprise selecting an area of a substrate that includes a fiducial and forming a shield proximate the fiducial. The substrate is processed in a selected area situated so that shield is between the fiducial and the selected area. The shield can be formed with ion beam assisted chemical vapor deposition (CVD), electron beam assisted CVD, or laser beam assisted CVD. The shield can be formed of one or more of tungsten, carbon, or platinum. The shield can extend in a U-shape about the fiducial or along a line. The substrate can be processed in the selected area by charged particle beam milling. A height of the shield can be at least one-quarter or one-half of a distance from the shield to a distal fiducial alignment feature. The selected area of the substrate processed with the ion beam can be situated less than the distance from the shield to the distal fiducial alignment feature.

Substrates comprise a fiducial and a shield having a shield height, the shield situated at a distance of less than two shield heights from the fiducial and defining a processing area, wherein the shield is situated between the processing area and the fiducial. The substrate can be a semiconductor substrate. The shield can be formed by ion or electron beam assisted chemical vapor deposition and can be formed of one or more of tungsten, platinum, and carbon. The shield can be U-shaped and situated about the fiducial or a linear ridge. A CPB or laser milled feature can be situated in the processing area and the shield situated at a distance of less than the shield height from the fiducial.

Charged particle beam (CPB) processing systems comprise a CPB source situated to direct a focused CPB to a substrate having a fiducial. At least one CVD source is operable to produce a shield on the substrate in response to the CPB from the CPB source. A processor is operable to direct the CPB source to form the shield on the substrate with the CPB and the CVD source, wherein the shield has a shield height and is situated at a distance of less than two times the shield height from the fiducial, direct the CPB source to process a selected area of the substrate, the selected area situated on a distal side of the shield with respect to the fiducial. The processor can be operable to control the CPB to form the shield at a shield location based on one of more of a substrate specification and a substrate image. A scanning electron microscope (SEM) imaging system can be included, wherein the processor is operable to determine a reference location on the substrate with the fiducial based on an SEM image that includes an image portion associated with the fiducial after the CPB beam processing of the selected area.

The foregoing and other features, and advantages of the disclosed technology will become more apparent from the following detailed description, which proceeds with reference to the accompanying figures.

BRIEF DESCRIPTION OF THE DRAWINGS

FIG. 2B is sectional view corresponding to FIG. 2A.

DETAILED DESCRIPTION

Introduction

Figure 1A:
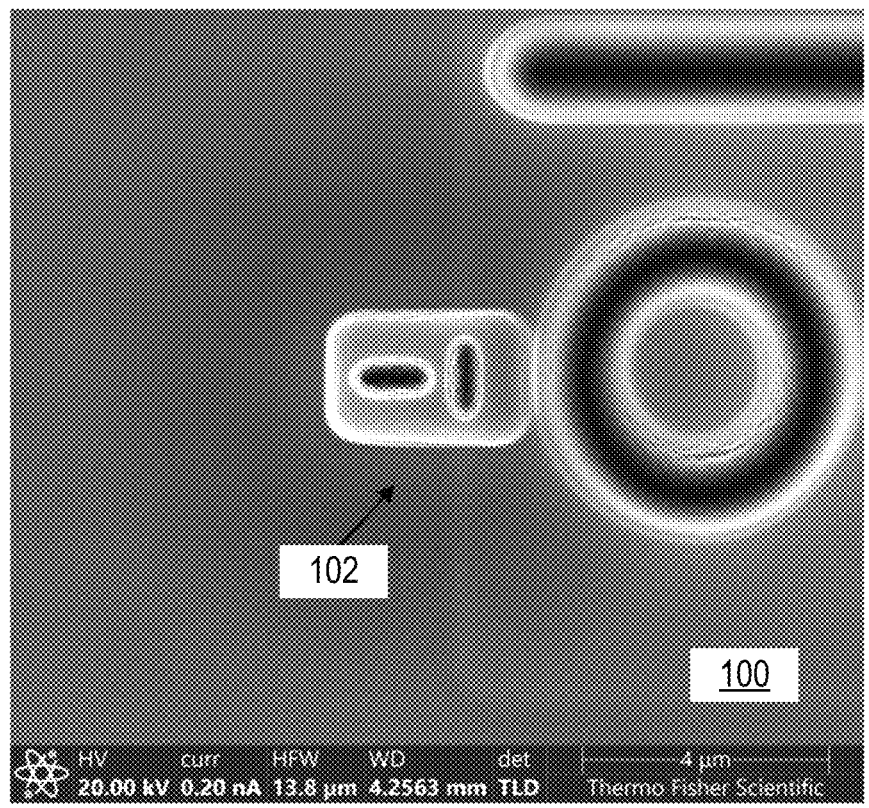
FIGS. 1A-1B illustrate deposition/modification of material on fiducials caused by milling with a focused ion beam.
Figure 1B:
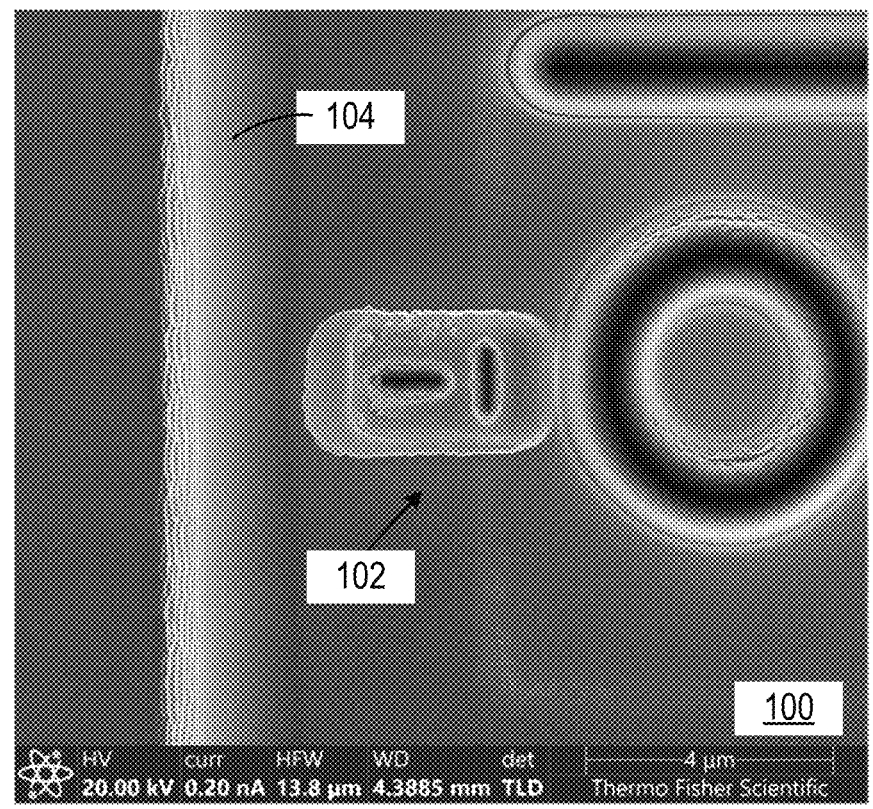

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

As used herein, "image" refers to a visual display suitable for viewing by an operator, technician, or other person or to data associated with such visual displays. Images thus include data files such as jpg, tiff, bmp, or files in other formats. In some examples below, visual images are provided for purposes of explanation or for operator assisted processing, but digital images are typically used in computations.

The disclosed examples pertain to shields that can be used to protect fiducials used to establish reference locations on substrates such as NAND or logic substrates. The shields can reduce material redeposition or other fiducial impairments that otherwise result from charged particle beam or laser beam substrate processing, particularly milling. Other substrates can be similarly processed. In the examples, fiducials are used to provide reference markings such as edges for two orthogonal directions, conveniently referred to as an x-direction and a y-direction. Other fiducials can be used, including those that provide reference markings along a single direction or along two linearly independent but non-orthogonal directions. In typical examples, a fiducial is imaged or scanned to establish a reference location such as a (0,0) location on substrate. Redeposition on the fiducial by milling nearby can cause degradation of the fiducial and subsequent reference precision. The fiducial is generally re-imaged or re-scanned during processing so that the reference location can be re-established for various process steps. Ion or electron beam processing or other processing steps (typically processing with a focused ion or electron beam, or generally, a focused charged particle beam) can degrade the fiducial by, for example, redeposition of material removed by ion beam milling. In some cases, pattern matching is used to establish the reference location and any degradation of the fiducial appearance can be a significant challenge. The disclosed approaches can control or eliminate such fiducial degradation. Other substrate features can be similarly protected.

Shields can be placed within 0.5, 1, 2, 2.5, 5, 10, 25, or 50 µm of an area to be ion beam milled and can have heights measured from a substrate surface or a surface of a fiducial of at least 1, 2, 2.5, 5, 7.5, 10, 12.5, 15, 20, 25, 30, 40, or 50 µm.

The examples are described with reference to ion beam milling, but the disclosed shields and processing approaches can be used with laser milling, electron beam milling, or charged particle beam (CPB) milling of any kind as well. The milling beam whether a CPB, a laser beam, or other beam can also be used to form a shield using laser or CPB-assisted chemical vapor deposition (CVD). The same or different beams can be used for milling and shield formation.

Example 1

Figure 2A:
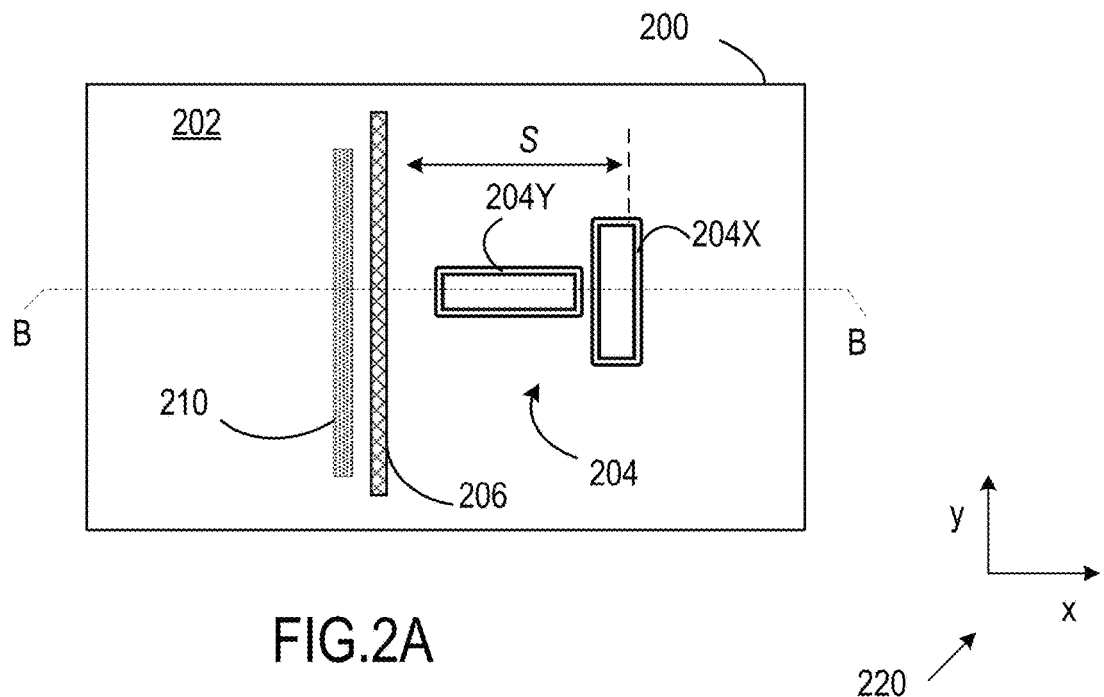
FIGS. 2A-2B are schematic diagrams illustrating reduction of deposition of material on fiducials in focused ion beam milling using a shield between a work area and the fiducials.
Figure 2B:
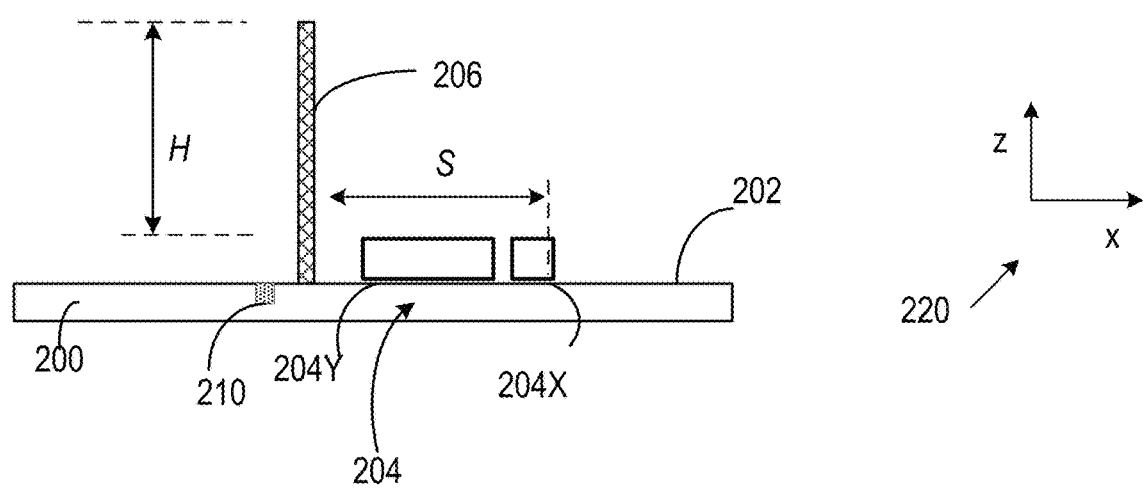

Referring to FIGS. 2A-2B, a substrate 200 such as a semiconductor substrate includes a surface 202 on which a fiducial 204 is defined. The fiducial 204 includes an x-fiducial 204X and a y-fiducial 204Y that can be used to establish substrate location along an x-direction and a y-direction as specified in a representative coordinate system 220. Typically the x-fiducial 204X and the y-fiducial 204Y define aperture edges that extend along the x-axis and the y-axis, respectively, and these edges are detected and used for substrate alignment. However, other fiducials can be used and the fiducial 204 is used as a representative example. A shield 206 extends from the surface 202 to a height H and an alignment or location feature of the fiducial 204 that is most distant from the shield (a distal feature) is a distance S from the fiducial 204. An ion beam milled feature 210 is situated on an opposites side of the shield 206 from the fiducial 204. Processing the substrate 200 with an ion beam or laser beam can result in material redeposition on the fiducial. The height H of the shield can be 0.1, 0.25, 0.5, 0.75, 1.0, 1.5, 2.0, 2.5, 5, or 10 times greater than the distance S to the distal feature of the fiducial can reduce or eliminate this redeposition.

The distance S is generally measured from a peak height of the shield and the most distal feature of the shield 204 can be a most distal feature that is intended for use—in some cases, alignment is based on a selected fiducial feature that need not be the most distal feature. For example, for processing that requires y-alignment only, the distance S could be a distance to a feature on the y-fiducial 204Y.

Example 2

Figure 2C:
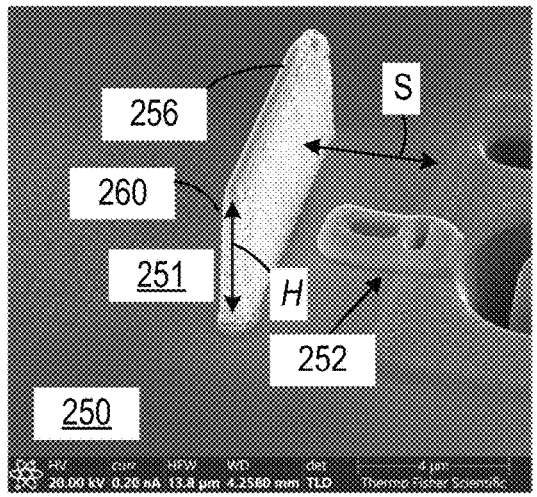
FIGS. 2C-2D are SEM images of a substrate with a shield before and after ion beam milling nearby.
Figure 2D:
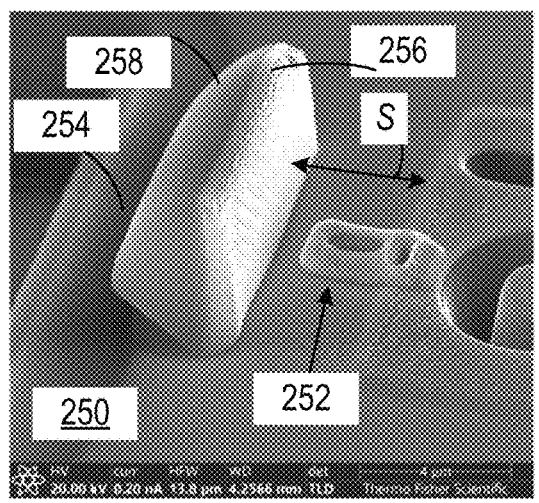

FIG. 2C illustrates a semiconductor substrate 250 on which a linear shield 256 is defined to separate a fiducial 252 from a processing area 251. FIG. 2D illustrates the semiconductor substrate 250 after ion beam milling of a groove 254 in the processing area 251. A distal side 260 of the shield 256 (distal with respect to the fiducial 252) has accumulated additional material 258 in response to the ion beam milling but features on the fiducial 250 remain distinct.

Example 3

Figure 3A:
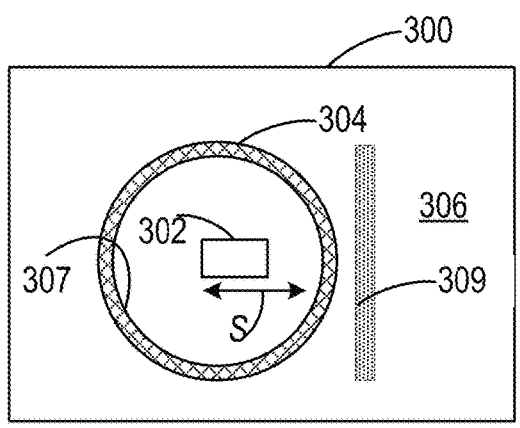
FIGS. 3A-3B illustrate alternative arrangements of ion beam shields.
Figure 3B:
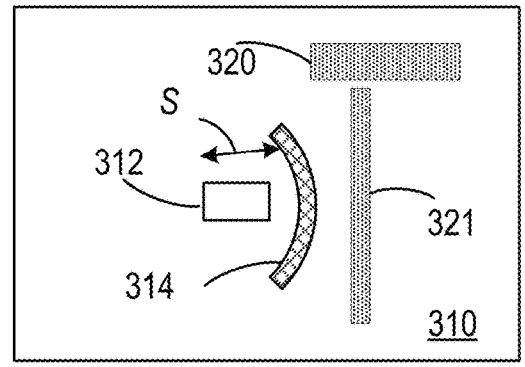

FIG. 3A illustrates a substrate 300 on which a circular shield 304 is defined to separate a fiducial 302 from a processing area 306 that extends around the circular shield 304. A distance S between a distal side 307 of the shield 304 (distal with respect to the processing area 306) and the shield 302 is less than 10, 5, 2.5, 2, 1, 0.5, 0.25, or 0.1 times a shield height measured from a surface of the substrate 300 or from a surface of the fiducial. Ion beam milled features in the processing area 306 such as channel 309 are typically separated from the shield 304 by a distance that is less than 10, 5, 2.5, 2, 1, 0.5, 0.25, or 0.1 times a shield height. FIG. 3B illustrates an arc-shaped shield 314 situated on a substrate 310 and that separates a fiducial 312 from features 320, 321 to be ion beam milled.

Example 4

Figure 4A:
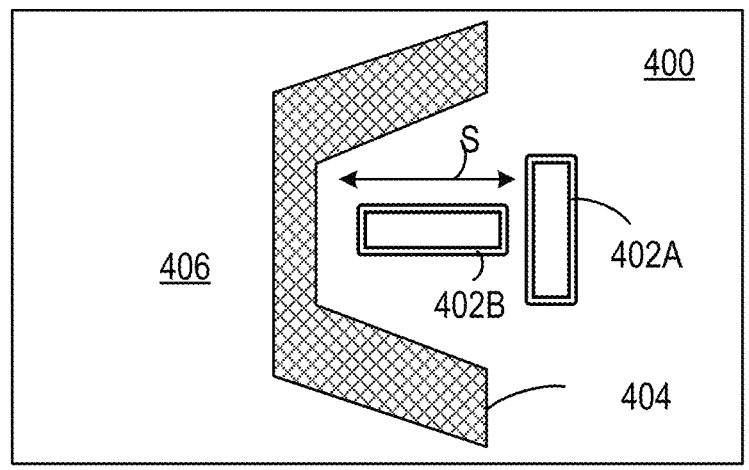
FIG. 4A is a schematic diagram illustrating another alternative shield.
Figure 4B:
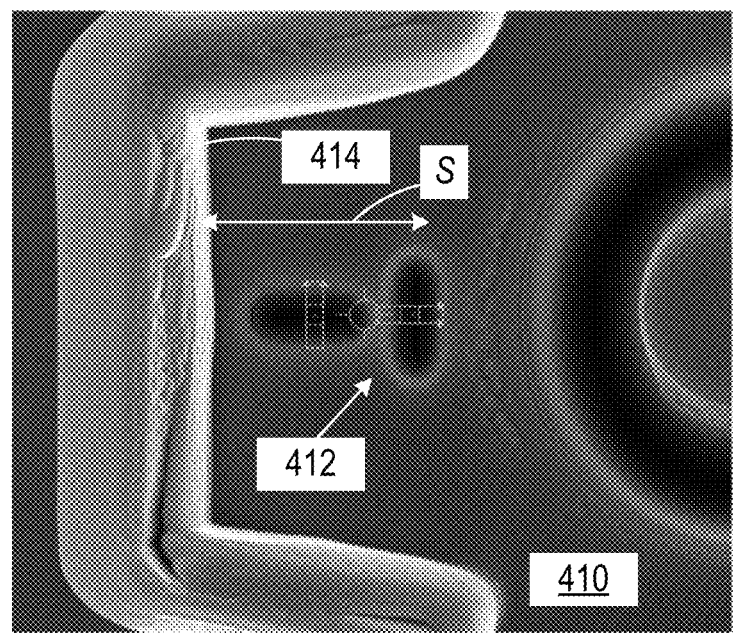
FIG. 4B is an SEM image of a substrate with an ion beam shield similar to that of FIG. 4A prior to ion beam milling.

FIG. 4A illustrates a substrate 400 on which a u-shaped shield 404 is defined to separate a fiducial 402 that includes portions 402A, 402B from a processing area 406 that extends around the u-shaped shield 404. A distance S between a distal side of the shield 404 (distal with respect to the processing area 406) and the u-shaped shield 404 is less than 10, 5, 2.5, 2, 1, 0.5, 0.25, or 0.1 times a shield height measured from a surface of the substrate 400 or a surface of the fiducial 402. FIG. 4B illustrates a u-shaped shield 414 defined on a substrate 410 and that separates a fiducial 412 from one or more features to be ion beam milled in a substrate region separated from the fiducial 412 by the u-shaped shield 414.

Example 5

Figure 5:
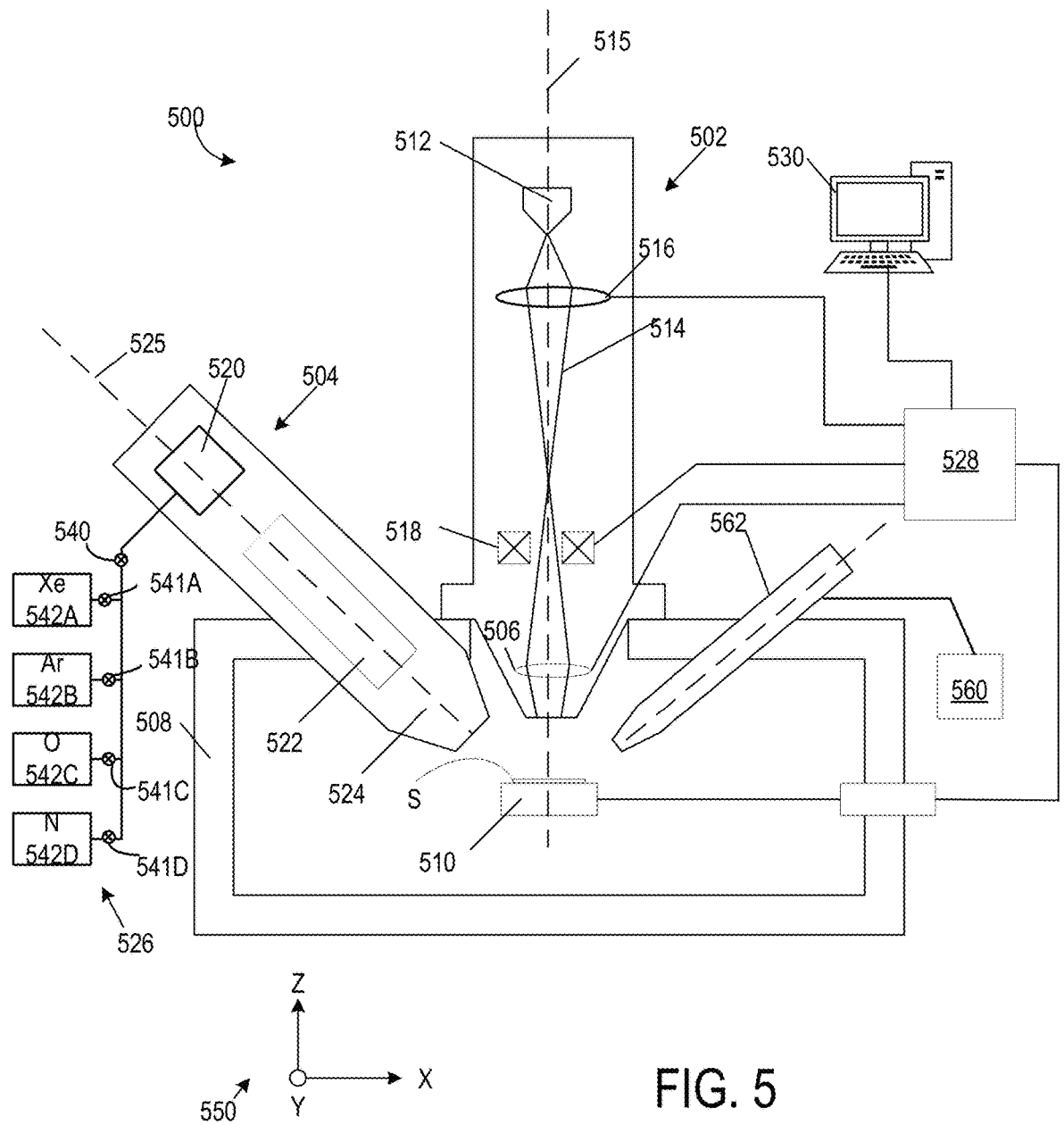
FIG. 5 illustrates a representative dual beam (electron/ion beam) system for use in ion beam milling, electron beam imaging, ion beam assisted fiducial depositions, and ion beam assisted depositions of shields to reduce contamination of fiducials and other sample features situated near areas to be ion milled.

Referring to FIG. 5, in a representative embodiment, a dual-beam system 500 comprises a scanning electron microscope (SEM) 502 and an ion beam column 504. The SEM 502 can comprise one or more charged particle beam (CPB) lenses such as a condenser lens 516 and an objective lens 506. In some embodiments, one or more CPB lenses can be magnetic lenses, and particularly, the objective lens 506 can be a magnetic objective lens. The ion beam column 504 is arranged to provide a focused ion beam (FIB) to a sample S, and the SEM 502 is situated for production of an image of the sample S. The SEM 502 and the ion beam column 504 can be mounted to a vacuum chamber 508 housing a movable substrate holder 510 for holding a sample S. The vacuum chamber 508 can be evacuated using vacuum pumps (not shown). The substrate holder 510 can be movable in the X-Y plane as shown with respect to a coordinate system 550, wherein a Y-axis is perpendicular to a plane of the drawing. The substrate holder 510 can further move vertically (along a Z-axis) to compensate for variations in the height of the sample S. In some embodiments, the SEM 502 can be arranged vertically above the sample S and can be used to image the sample S, and the ion beam column 504 can be arranged at an angle and can be used to machine and/or process the sample S. FIG. 5 shows an exemplary orientation of the SEM 502 and the ion beam column 504. In some examples, a substrate holder can be tilted so that either an electron beam such as an SEM electron beam or an ion beam such as focused ion beam (FIB) can be applied from vertically below the sample for various milling or imaging operations.

The SEM 502 can comprise an electron source 512 and can be configured to manipulate a "raw" radiation beam from the electron source 512 and perform upon it operations such as focusing, aberration mitigation, cropping (using an aperture), filtering, etc. The SEM 502 can produce a beam 514 of input charged particles (e.g., an electron beam) that propagates along a particle-optical axis 515. The SEM 502 can generally comprise one or more lenses (e.g., CPB lenses) such as the condenser lens 516 and the objective lens 506 to focus the beam 514 onto the sample S. In some embodiments, the SEM 502 can be provided with a deflection unit 518 that can be configured to steer the beam 514. For example, the beam 514 can be steered in a scanning motion (e.g., a raster or vector scan) across a sample being investigated.

The dual-beam system 500 can further comprise a computer processing apparatus and/or a control unit 528 for controlling inter alia the deflection unit 518, charged particle beam (CPB) lenses 506, 516, and detectors (not shown), and for displaying information gathered from the detectors on a display unit. The control unit 528 can also control an ion beam 524 to mill or otherwise remove material from selected areas of the sample S, deposit fiducials, and to deposit shields to reduce the redeposition of material removed by milling onto a fiducial or other structure on the specimen S. In some cases, a control computer 530 is provided to establish various excitations, control FIB milling, form one or more shields or one or more fiducials, align the sample S using a fiducial before or after ion beam milling operations, record imaging data, and generally control operation of both the SEM 502 and the ion beam column 504.

Referring still to FIG. 5, the ion beam column 504 can comprise an ion source (e.g., a plasma source 520) and ion beam optics 522. In the illustrated embodiment, the ion beam column 504 is a plasma focused ion beam (PFIB), however, in other embodiments, the ion beam column 504 can be a standard focused ion beam (FIB) having a liquid metal ion source (LMIS), or any other ion source compatible with a focused ion beam column. The ion beam column 504 can produce and/or direct the ion beam 524 along an ion-optical axis 525. As mentioned above, the ion column 504 can be used to perform imaging, processing and/or machining operations on the substrate, such as incising, milling, etching, depositing, etc.

In embodiments wherein the ion beam is a PFIB, the ion source 520 can be fluidly coupled to a plurality of gases via a gas manifold 526 that includes gas sources 542A-542D coupled by respective valves 541A-541D to the ion source 520. A valve 540 is situated to selectively couple gases from the gas manifold 526 to the ion source 520. Exemplary gases include, but are not limited to, xenon, argon, oxygen, and nitrogen as shown in FIG. 5. During operation of the ion source 520, a gas can be introduced, where it becomes charged or ionized, thereby forming a plasma. Ions extracted from the plasma can then be accelerated through the ion beam column 504, becoming an ion beam.

Shields can be formed using ion-beam assisted deposition with the dual beam system 500. A gas delivery system 560 is coupled to expose a surface of the sample S to a suitable gas via a gas inlet 562, typically a precursor gas that consists of organometallic molecules. When the surface of the sample S is exposed to the precursor, the ion beam can decompose the organometallic molecules locally and deposit material onto the surface. The materials used for ion beam-induced chemical vapor deposition (CVD) in the dual-beam system 500 are determined by their different gas chemistries, and several precursor gases are available for the deposition of Pt, W, $SiO_2$, C, and other materials. Shield location and height are configured by the control computer 530 based on location to be ion beam milled and fiducial location. Fiducial location and shape can also be controlled with the control computer 530. In some examples, substrates are provided with shields and/or fiducials prior to introduction into the dual beam system 500.

Example 6

Figure 6:
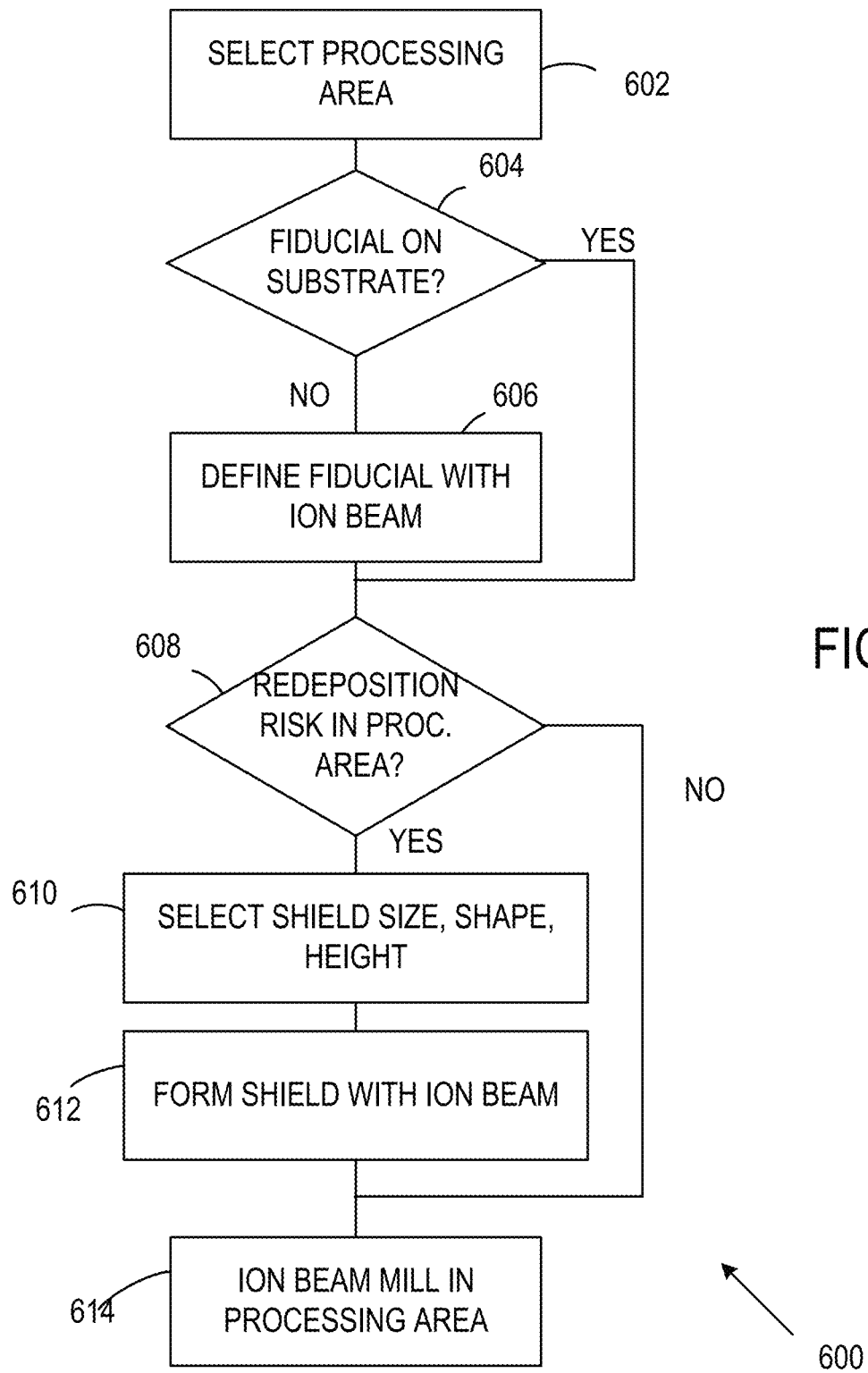
FIG. 6 illustrates a representative ion beam milling method.

Referring to FIG. 6, a representative method 600 includes selecting an area of a substrate for ion beam processing at 602 and determining if a suitable fiducial is available on the substrate at 604. If so, processing continues to determining if ion beam processing of the selected area is associated with redeposition on the fiducial at 608. If redeposition is not indicated, ion beam milling is performed in the selected area at 614. If redeposition is indicated, at 610, shield parameters such as shape, height, material, location, and orientation are selected. At 612, the shield is formed, and ion beam milling is then performed at 614. If a suitable fiducial is not available at 604, a fiducial design is selected and formed on the substrate using ion beam assisted chemical vapor deposition at 606. Additional substrate areas can be selected and similarly processed.

Example 7

Figure 7:
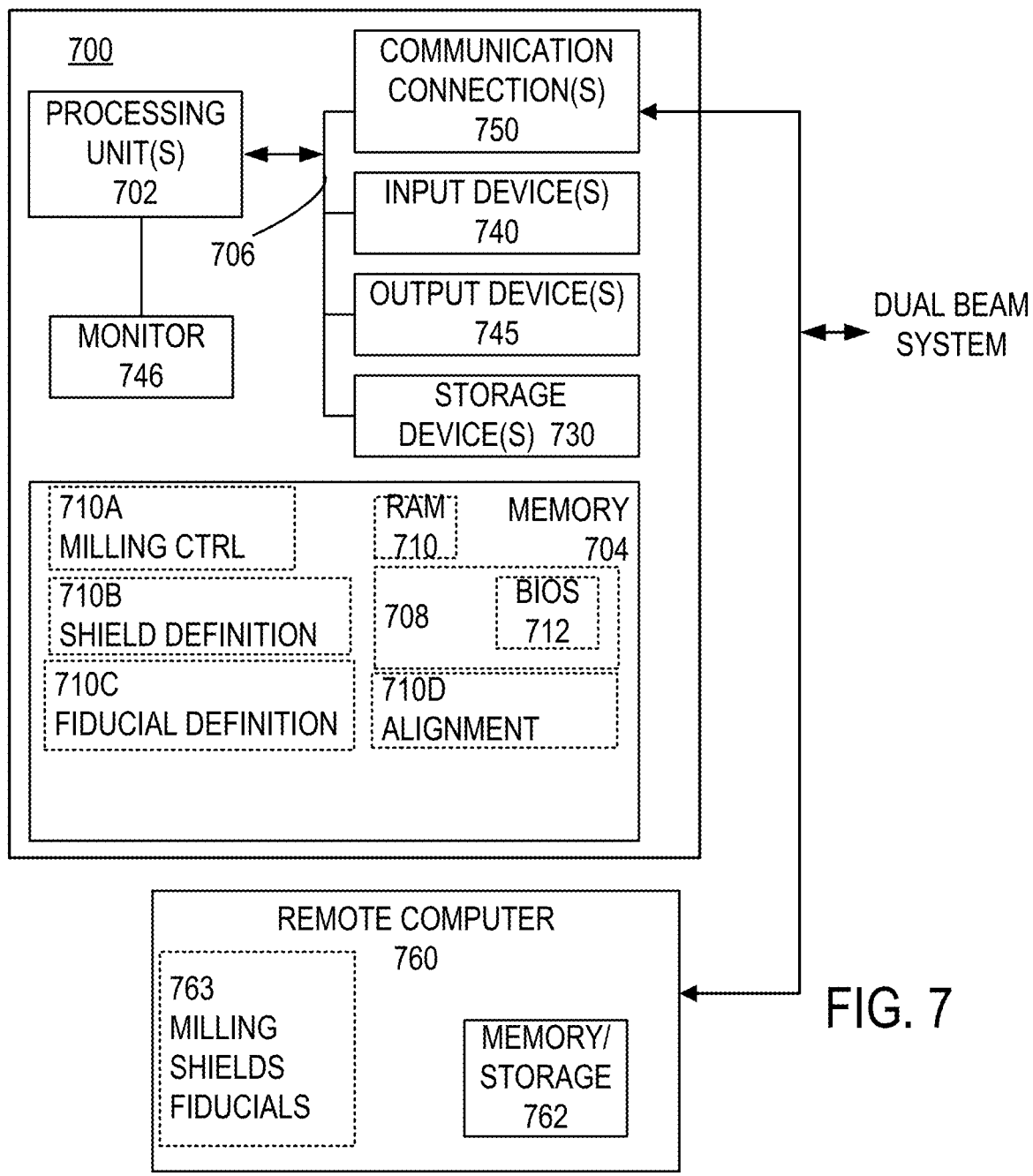
FIG. 7 illustrates a representative computer environment for use with the disclosed approaches.

In some examples, one or more of ion beam milling, fiducial formation, shield formation, electron microscopic imaging, and substrate evaluation are controlled with computer-executable instructions stored in one or more computer readable storage devices either at or near an ion beam/electron beam system or coupled via a wide area network. FIG. 7 and the following discussion are intended to provide a brief, general description of an exemplary computing environment for controlling these operations. In other examples, individual processor-based controls can be provided for sample stages, electron columns, ion beam columns or image and sample evaluation. The disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network.

With reference to FIG. 7, an exemplary system for implementing the disclosed technology includes a general purpose computing device in the form of an exemplary conventional PC 700, including one or more processing units 702, a system memory 704, and a system bus 706 that couples various system components including the system memory 704 to the one or more processing units 702. The system bus 706 may be any of several types of bus structures including a memory bus or memory controller, a peripheral bus, and a local bus using any of a variety of bus architectures. The exemplary system memory 704 includes read only memory (ROM) 708 and random access memory (RAM) 710. A basic input/output system (BIOS) 712, containing the basic routines that help with the transfer of information between elements within the PC 700, is stored in ROM 708. In the example of FIG. 7, data and processor-executable instructions for controlling FIB milling such as establishing beam orientations, beam currents, specimen position and orientation are stored in a memory 710A. Data and data and processor-executable instruction for forming shields and fiducials are stored in memory portions 710B, 710C, respectively. Data and data and processor-executable instruction for substrate alignment using shielded fiducials are stored in a memory portion 710D.

The exemplary PC 700 further includes one or more storage devices 730 such as a hard disk drive for reading from and writing to a hard disk, a magnetic disk drive for reading from or writing to a removable magnetic disk, and an optical disk drive. Such storage devices can be connected to the system bus 706 by a hard disk drive interface, a magnetic disk drive interface, and an optical drive interface, respectively. The drives and their associated computer readable media provide nonvolatile storage of computer-readable instructions, data structures, program modules, and other data for the PC 700.

A number of program modules may be stored in the storage devices 730 including an operating system, one or more application programs, other program modules, and program data. A user may enter commands and information into the PC 700 through one or more input devices 740 such as a keyboard and a pointing device such as a mouse. A monitor 746 or other type of display device is also connected to the system bus 706 via an interface, such as a video adapter. Output devices 745 such as printers can also be provided.

The PC 700 may operate in a networked environment using logical connections to one or more remote computers, such as a remote computer 760. In some examples, one or more network or communication connections 750 are included. The remote computer 760 may be another PC, a server, a router, a network PC, or a peer device or other common network node, and typically includes many or all of the elements described above relative to the PC 700, although only a memory storage device 762 has been illustrated in FIG. 7. The personal computer 700 and/or the remote computer 760 can be connected to a logical a local area network (LAN) and a wide area network (WAN). As shown in FIG. 7, the remote computer 760 includes the memory storage device 762 as well as a memory 763 for data and processor-executable instructions for ion beam milling and shield and fiducial formation and other control operations.

In view of the many possible embodiments to which the principles of the disclosure may be applied, it should be recognized that the illustrated embodiments are only examples and should not be taken as limiting the scope of the disclosure.

We claim:

1. A method, comprising:
   selecting an area of a substrate that includes a fiducial;
   forming a shield on the substrate proximate the fiducial, wherein the shield has a shield height and is situated at a distance of less than two shield heights from the fiducial; and
   processing the substrate in a selected area situated so that the shield is between the fiducial and the selected area, wherein the substrate is processed in the selected area by ion beam milling so that the fiducial is protected by the shield during the ion beam milling.

2. The method of claim 1, wherein the shield is formed with ion beam assisted chemical vapor deposition (CVD), electron beam assisted CVD, or laser beam assisted CVD.

3. The method of claim 2, wherein the shield is formed of one or more of tungsten, carbon, or platinum.

4. The method of claim 1, wherein the shield extends in a U-shape about the fiducial.

5. The method of claim 1, wherein the shield extends along a line.

6. The method of claim 1, wherein a height of the shield is at least one-quarter of a distance from the shield to a distal fiducial alignment feature.

7. The method of claim 6, wherein the height of the shield is at least one-half of a distance from the shield to the distal fiducial alignment feature.

8. The method of claim 7, wherein the height of the shield is at least the distance from the shield to the distal fiducial alignment feature.

9. The method of claim 1, wherein the selected area of the substrate processed with ion beam milling is situated less from a distal portion of the shield a distance that is less than the distance from the shield to the distal fiducial alignment feature.

10. The method of claim 7, wherein a height of the shield is at least one-quarter of a distance from the shield to a distal fiducial alignment feature.

11. A substrate, comprising:
a fiducial defined on the substrate; and
a shield having a shield height and situated on the substrate and spaced apart from the fiducial, the shield situated at a distance of less than two shield heights from the fiducial, wherein the shield is situated on the substrate between a processing area on the substrate and the fiducial so as to protect the fiducial during ion beam milling of the processing area.

12. The substrate of claim 11, wherein the substrate is a semiconductor substrate.

13. The substrate of claim 11, wherein the shield on the substrate is circular.

14. The substrate of claim 11, wherein the shield is formed of one or more of tungsten, platinum, and carbon.

15. The substrate of claim 12, wherein the shield is U-shaped and is situated about the fiducial.

16. The substrate of claim 12, wherein the shield is a linear ridge.

17. The substrate of claim 11, further comprising a grooved feature in the processing area.

18. The substrate of claim 11, wherein the shield is situated at a distance of less than the shield height from the fiducial.

19. The substrate of claim 18, further comprising a grooved feature in the processing area, wherein the grooved feature is at a distance of less than the shield height from the shield.

20. A charged particle beam (CPB) processing system, comprising:
a CPB source situated to direct a focused CPB to a substrate having a fiducial;
at least one CVD source operable to produce a shield on the substrate in response to the CPB from the CPB source; and
a processor operable to:
select an area of a substrate that includes a fiducial,
direct the CPB source to form the shield on the substrate with the CPB and the CVD source, wherein the shield is spaced apart from the fiducial, the shield having a shield height and is situated at a distance of less than two times the shield height from the fiducial,
direct the CPB source to process a selected area of the substrate by ion beam milling, the selected area situated on a distal side of the shield with respect to the fiducial so that so that the fiducial is protected by the shield during the ion beam milling.

21. The CPB processing system of claim 20, wherein the processor is operable to form the shield at a shield location based on one of more of a substrate specification and a substrate image.

22. The CPB processing system of claim 21, further comprising a scanning electron microscope (SEM) imaging system, wherein the processor is operable to determine a reference location on the substrate with the fiducial based on an SEM image that includes an image portion associated with the fiducial after the CPB beam processing of the selected area.

23. The method of claim 1, wherein the selected area of the substrate to be processed is situated less than 10 μm from a distal portion of the fiducial.

24. The CPB processing system of claim 20, wherein the processor is configured to direct the CPB source to process the selected area of the substrate by ion beam milling, wherein the selected area is situated less than 10 μm from a distal portion of the fiducial.

* * * * *

UNITED STATES PATENT AND TRADEMARK OFFICE
CERTIFICATE OF CORRECTION

PATENT NO. : 11,817,395 B2
APPLICATION NO. : 17/037276
DATED : November 14, 2023
INVENTOR(S) : Sean Morgan-Jones et al.

It is certified that error appears in the above-identified patent and that said Letters Patent is hereby corrected as shown below:

In the Claims

In Column 9, Claim 15, Line 24, delete "claim 12," and insert -- claim 11, --, therefor.

In Column 9, Claim 16, Line 26, delete "claim 12," and insert -- claim 11, --, therefor.

In Column 10, Claim 20, Line 17, delete "so that so that" and insert -- so that --, therefor.

In Column 10, Claim 21, Line 21, delete "one of more" and insert -- one or more --, therefor.

Signed and Sealed this
Ninth Day of July, 2024

Katherine Kelly Vidal
*Director of the United States Patent and Trademark Office*